(12) United States Patent
Lin et al.

(10) Patent No.: US 10,892,360 B2
(45) Date of Patent: Jan. 12, 2021

(54) SEMICONDUCTOR DEVICE STRUCTURE WITH HIGH VOLTAGE DEVICE

(71) Applicant: Taiwan Semiconductor Manufacturing Co., Ltd., Hsinchu (TW)

(72) Inventors: Hung-Chou Lin, Douliu (TW);
Yi-Cheng Chiu, New Taipei (TW);
Karthick Murukesan, Hsinchu (TW);
Yi-Min Chen, Hsinchu (TW);
Shiuan-Jeng Lin, Hsinchu (TW);
Wen-Chih Chiang, Hsinchu (TW);
Chen-Chien Chang, Zhubei (TW);
Chih-Yuan Chan, Kaohsiung (TW);
Kuo-Ming Wu, Hsinchu (TW);
Chun-Lin Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/173,721

(22) Filed: Oct. 29, 2018

(65) Prior Publication Data
US 2019/0165167 A1 May 30, 2019

Related U.S. Application Data

(60) Provisional application No. 62/590,808, filed on Nov. 27, 2017.

(51) Int. Cl.
*H01L 29/78* (2006.01)
*H01L 29/08* (2006.01)
(Continued)

(52) U.S. Cl.
CPC ...... *H01L 29/7816* (2013.01); *H01L 29/0649* (2013.01); *H01L 29/0692* (2013.01);
(Continued)

(58) Field of Classification Search
None
See application file for complete search history.

(56) References Cited

U.S. PATENT DOCUMENTS

| 6,750,506 B2 * | 6/2004 | Noda | ..................... H01L 29/404 257/296 |
| 2001/0004124 A1 * | 6/2001 | Noda | ..................... H01L 29/404 257/401 |

(Continued)

*Primary Examiner* — Zandra V Smith
*Assistant Examiner* — Lawrence C Tynes, Jr.
(74) *Attorney, Agent, or Firm* — Eschweiler & Potashnik, LLC

(57) ABSTRACT

A high-voltage semiconductor device structure is provided. The high-voltage semiconductor device structure includes a semiconductor substrate, a source ring in the semiconductor substrate, and a drain region in the semiconductor substrate. The high-voltage semiconductor device structure also includes a doped ring surrounding sides and a bottom of the source ring and a well region surrounding sides and bottoms of the drain region and the doped ring. The well region has a conductivity type opposite to that of the doped ring. The high-voltage semiconductor device structure further includes a conductor electrically connected to the drain region and extending over and across a periphery of the well region. In addition, the high-voltage semiconductor device structure includes a shielding element ring between the conductor and the semiconductor substrate. The shielding element ring extends over and across the periphery of the well region.

20 Claims, 10 Drawing Sheets

(51) Int. Cl.
*H01L 29/06* (2006.01)
*H01L 29/423* (2006.01)
*H01L 29/40* (2006.01)

(52) U.S. Cl.
CPC ...... *H01L 29/0865* (2013.01); *H01L 29/0869* (2013.01); *H01L 29/0882* (2013.01); *H01L 29/0886* (2013.01); *H01L 29/402* (2013.01); *H01L 29/404* (2013.01); *H01L 29/4238* (2013.01); *H01L 29/42356* (2013.01); *H01L 29/42368* (2013.01)

(56) References Cited

U.S. PATENT DOCUMENTS

| | | | |
|---|---|---|---|
| 2011/0265051 A1* | 10/2011 | Yeh | G06F 30/367 |
| | | | 716/106 |
| 2012/0181629 A1* | 7/2012 | Su | H01L 29/404 |
| | | | 257/409 |
| 2014/0027811 A1* | 1/2014 | Chen | H01L 29/7436 |
| | | | 257/137 |
| 2014/0264583 A1 | 9/2014 | Yamaji et al. | |
| 2016/0141369 A1* | 5/2016 | Kim | H01L 29/1095 |
| | | | 257/655 |
| 2017/0125582 A1 | 5/2017 | Murukesan et al. | |
| 2019/0067190 A1* | 2/2019 | Wu | H01L 21/74 |

* cited by examiner

SEMICONDUCTOR DEVICE STRUCTURE WITH HIGH VOLTAGE DEVICE

PRIORITY CLAIM AND CROSS-REFERENCE

This Application claims the benefit of U.S. Provisional Application No. 62/590,808, filed on Nov. 27, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

High-voltage or ultrahigh-voltage metal-oxide-semiconductor (MOS) transistor devices have also been widely used in various applications. Ultra-high voltage metal-oxide-semiconductor field effect transistors (MOSFET) are typically fabricated with coplanar drain and source regions. Ordinarily, an ultrahigh voltage MOS transistor device can sustain a high drain voltage.

However, since feature sizes continue to decrease, the high-voltage MOSFET may be closer to nearby devices. The operation of the nearby devices may be affected by the high-voltage MOSFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
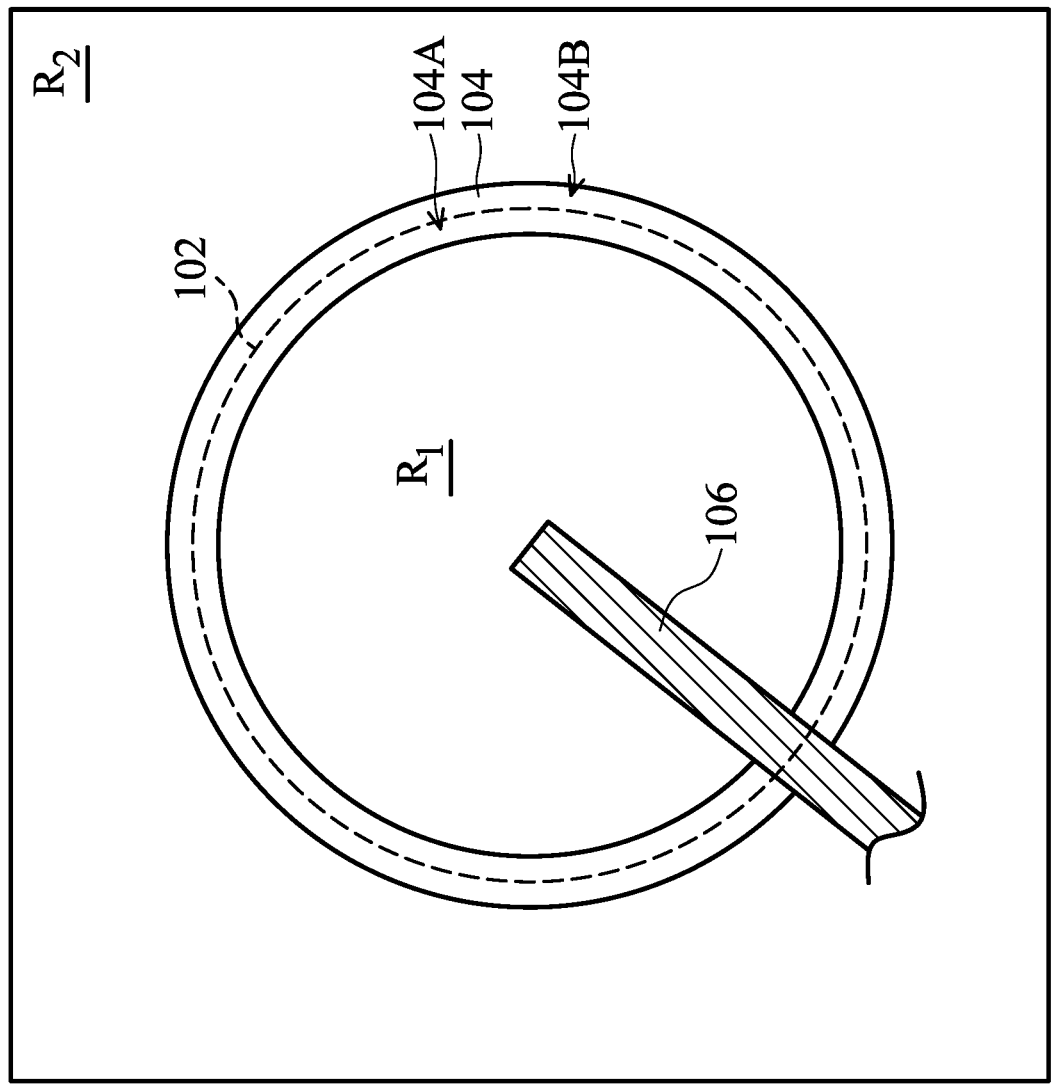
FIG. 1 is a layout top view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a layout top view of a semiconductor device structure 100, in accordance with some embodiments. In some embodiments, the semiconductor device structure 100 includes a high-voltage device region $R_1$ where one (or more) high-voltage device is formed. The high-voltage device may include a metal-oxide-semiconductor field-effect transistor (MOSFET) which is capable of operating at high voltage. For example, the high-voltage device is capable of operating at a voltage that is in a range from about 250 V to about 1000 V.

In some embodiments, the semiconductor device structure 100 also includes a low-voltage device region $R_2$ where one (or more) low-voltage device is formed. The low-voltage device operates at a lower voltage than the high-voltage device. In some embodiments, the low-voltage device region $R_2$ is adjacent to the high-voltage device region $R_1$. In some embodiments, the low-voltage device region $R_2$ laterally surrounds the high-voltage device region $R_1$.

In some embodiments, a first doped region (such as a well region) in the high-voltage device region $R_1$ is in direct contact with a second doped region (such as another well region) in the low-voltage device region $R_2$. In some embodiments, the first doped region has a conductivity type opposite to that of the second doped region. For example, the first doped region of the high-voltage device region $R_1$ is an n-type well region, and the second doped region of the low-voltage device region $R_2$ is a p-type well region. In some embodiments, the high-voltage device region $R_1$ has a periphery (or boundary) 102. In some embodiments, the periphery 102 is also an interface between the high-voltage device region $R_1$ and the low-voltage device region $R_2$.

In some embodiments, the semiconductor device structure 100 includes a conductor 106. The conductor 106 includes, for example, a conductive line. The conductor 106 is electrically connected to an element (such as a drain region or a source region) of the high-voltage device in the high-voltage device region $R_1$. The conductor 106 extends over and across the periphery 102 of the high-voltage device region $R_1$ and extends further over the low-voltage device region $R_2$.

During operation of the high-voltage device, a high voltage may be applied to the high-voltage device through the conductor 106. When the high voltage is applied to the high-voltage device through the conductor 106, the conductor 106 with high voltage may negatively affect the operation of the low-voltage device in the low-voltage device region $R_2$. For example, an inversion channel region may be unintentionally formed near the interface between the high-voltage device and the low-voltage device, which may form an electrical path leading to high leakage current.

In some cases, the low-voltage device may be formed at a position away from the high-voltage device to prevent the high leakage current. A forbidden area surrounding the high-voltage device region $R_1$ may be designed. The low-voltage device is formed outside of the forbidden area to maintain a sufficient distance from the high-voltage device region. Therefore, the low-voltage device may be prevented from being negatively affected by the high-voltage device. However, the design mentioned above would occupy larger die area, which negatively affects the scaling-down of the semiconductor device structure. The design flexibility is also limited.

As shown in FIG. 1, a shielding element 104 is formed to cover the periphery 102 between the high-voltage device region $R_1$ and the low-voltage device region $R_2$, in accordance with some embodiments. The shielding element 104 may be used to prevent the generation of the channel region near the interface between the high-voltage device and the low-voltage device. Leakage current may therefore be avoided or effectively reduced. In some embodiments, the shielding element 104 is positioned below the conductor 106 and above the periphery 102 of the high-voltage device region $R_1$.

In some embodiments, the shielding element 104 extends over and across the periphery 102 of the high-voltage device region $R_1$. In some embodiments, the shielding element 104 is a ring structure. In some embodiments, the shielding element 104 is a shielding element ring. In some embodiments, the shielding element 104 covers the periphery 102 of the high-voltage device region $R_1$. In some embodiments, the shielding element 104 encircles the high-voltage device region $R_1$. In some embodiments, the shielding element 104 has a first portion 104A extending on the high-voltage device region $R_1$. The shielding element 104 also has a second portion 104B extending on the low-voltage device region R2.

In some cases where a high voltage bias is applied on the conductor 106, an outer portion of the low-voltage region $R_2$ not covered by the shielding element 104 may become an inversion channel region due to the high electric field generated from the conductor 106. Electrons may accumulate in the inversion channel region. Meanwhile, a portion of the high-voltage region $R_1$ directly below the first portion 104A and an inner portion of the low-voltage region $R_2$ directly below the second portion 104B are shielded by the shielding element 104. Due to the shielding element 104, electric field generated from the conductor 106 is shield to avoid accumulating electrons in the region under the shielding element 104. That is, the region directly below the shielding element 104 is prevented from becoming an inversion channel region. The high-voltage region $R_1$ is therefore electrically separated from the inversion channel region in the outer portion of the low-voltage region $R_2$ by the region directly below the shielding element 104. Leakage path from the high-voltage region $R_1$ to the low-voltage region $R_2$ is therefore avoided.

In some embodiments, the shielding element 104 is made of a conductive material. The conductive material may include a metal material, a semiconductor material, one or more other suitable materials, or a combination thereof. In some embodiments, the shielding element 104 covers an entirety of the periphery 102 of the high-voltage device region $R_1$. In some embodiments, the shielding element 104 extends along the periphery 102 of the high-voltage device region $R_1$.

The electrical field from the conductor 106 applied with high voltage may be blocked or at least partially blocked by the shielding element 104. Therefore, the elements thereunder may be prevented from being negatively affected by the conductor 106 applied with high voltage. The performance and reliability of the semiconductor device structure 100 are significantly improved.

Figure 2A:
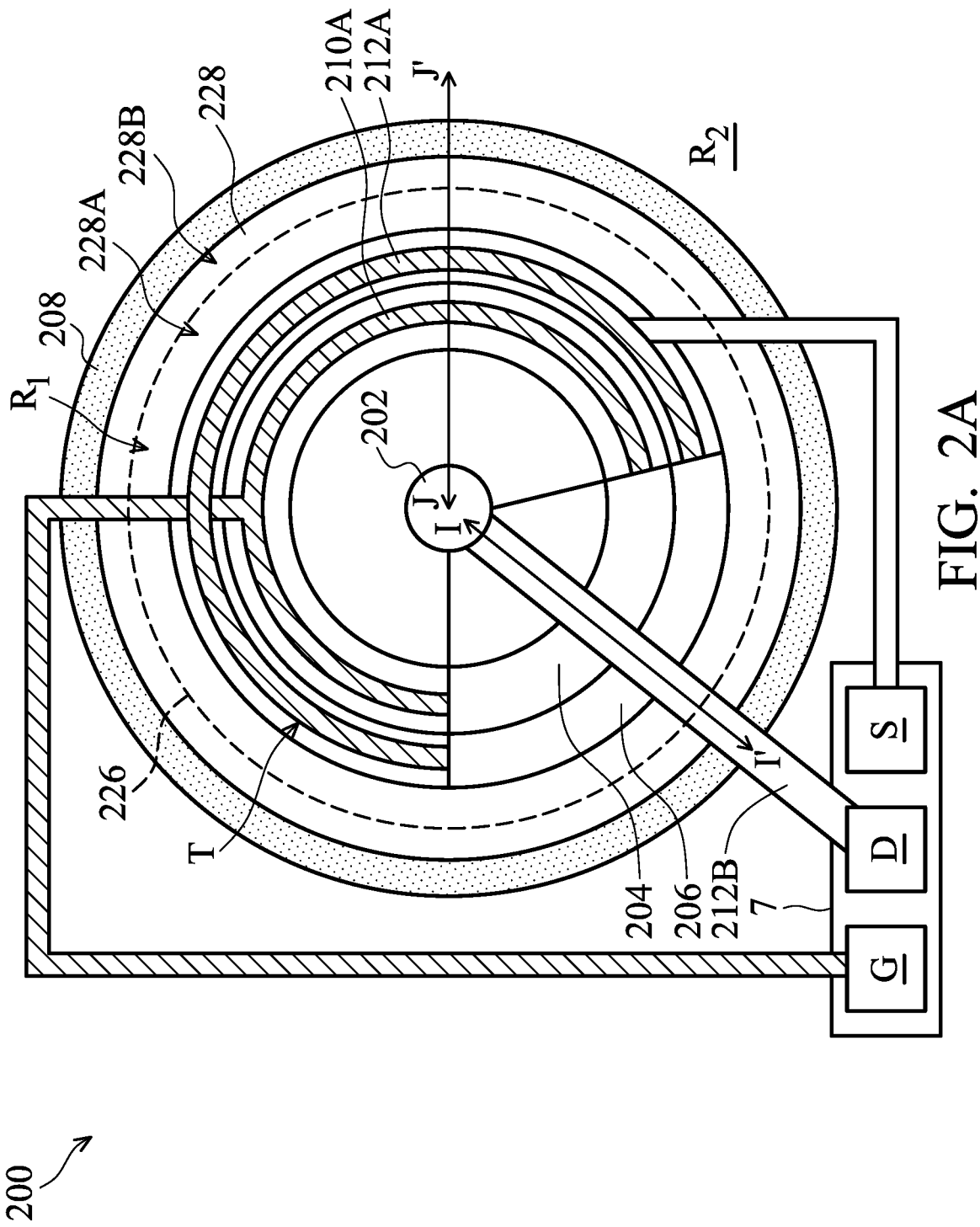
FIG. 2A is a layout top view of a semiconductor device structure, in accordance with some embodiments.
Figure 2B:
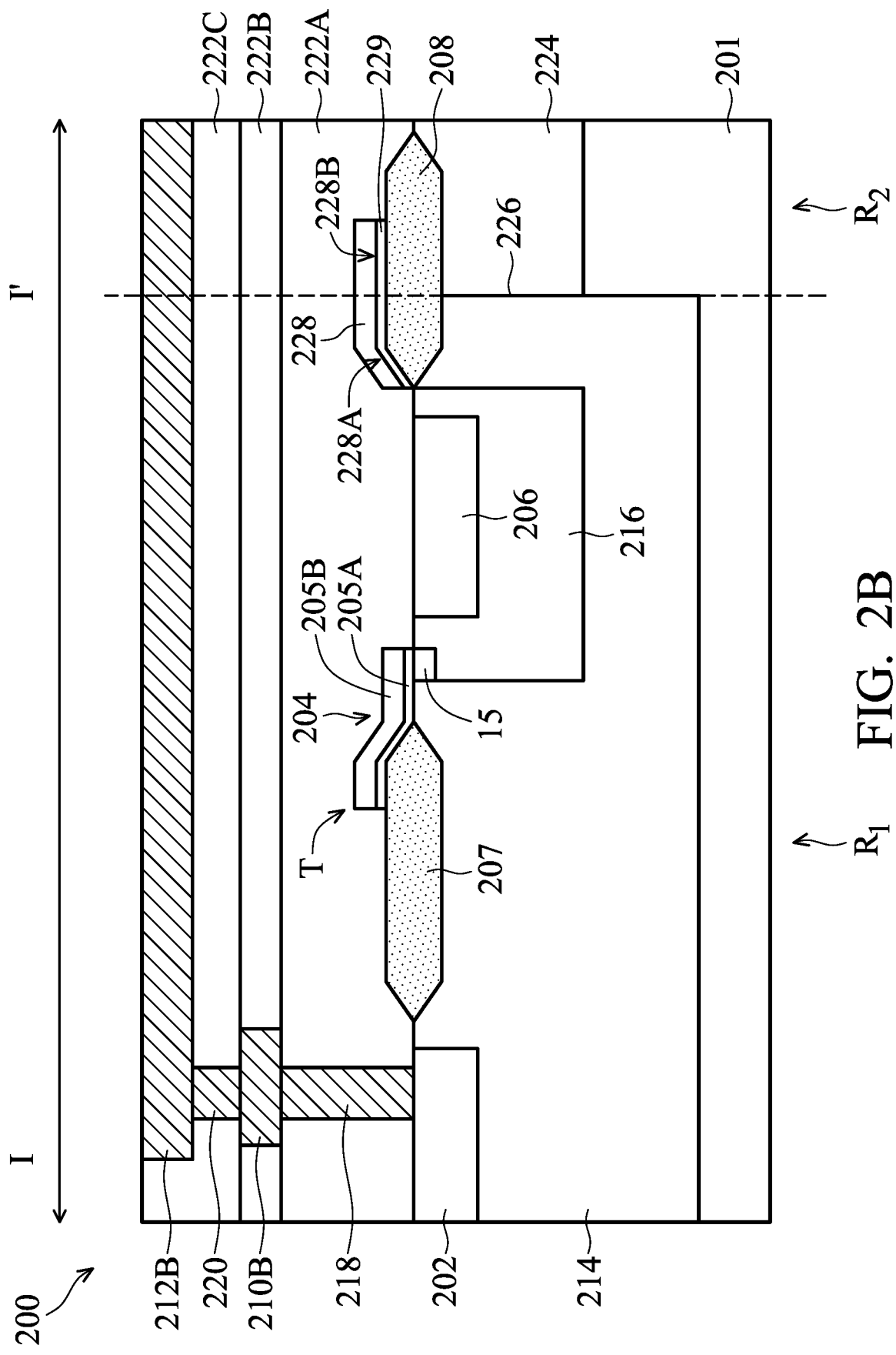
FIG. 2B is a cross-sectional view of a semiconductor device structure, in accordance with some embodiments.

FIG. 2A is a layout top view of a semiconductor device structure, in accordance with some embodiments. FIG. 2B is a cross-sectional view of a semiconductor device structure, in accordance with some embodiments. In some embodiments, FIG. 2B shows the cross-sectional view of the semiconductor device structure illustrated in FIG. 2A. The cross-sectional view may be taken along the line I-I'.

In some embodiments, as shown in FIGS. 2A and 2B, a semiconductor device structure 200 is provided. The semiconductor device structure 200 includes a high-voltage device region $R_1$ where one (or more) high-voltage device is formed. For example, a transistor T is formed in the high-voltage device region $R_1$.

As shown in FIGS. 2A and 2B, the semiconductor device structure 200 also includes a low-voltage device region $R_2$ where one (or more) low-voltage device is formed. The low-voltage device may include a transistor including a doped region 224, as shown in FIG. 2B. In some embodiments, the doped region 224 is a well region. For example, the doped region 224 is a p-type doped well region. In some other embodiments, the doped region 224 is n-type doped.

In some embodiments, the transistor T includes a doped region such as a drain region 202, a gate stack 204, and a doped region such as a source region 206. In some embodiments, the transistor T is a high-voltage MOSFET. In some embodiments, the source region 206 is a ring structure that laterally surrounds the drain region 202, as shown in FIG. 2A. In some embodiments, the source region 206 is a source ring.

In some embodiments, the drain region 202 takes the form of a circle, while each of the source region 206 and the gate stack 204 takes the form of a ring, as shown in FIG. 2A. Many variations and/or modifications can be made to embodiments of the disclosure. In some other embodiments, the top view of the drain region 202 has a shape other than circle. The top view shape of the drain region 202 may include rectangle, square, oval, polygon, or another suitable shape. The top view shape of the source region 206 or the gate stack 204 is a rectangular ring, a square ring, an oval ring, a polygonal ring, or another suitable ring.

In some embodiments, the drain region 202 is laterally surrounded by the gate stack 204, which in turn is laterally surrounded by the source region 206, as shown in FIG. 2A.

In some embodiments, the source region 206 is laterally surrounded by an isolation structure (or called isolation element) 208. The isolation structure 208 is configured to isolate electrical communication between the source region 206 and another electronic component, such as another transistor formed in the low-voltage device region $R_2$. The isolation structure 208 may include a shallow trench isolation (STI) feature, a local oxidation of silicon (LOCOS) feature, a field oxide (FOX) structure, a deep trench isolation (DTI) feature, one or more other suitable isolation features, or a combination thereof.

In some embodiments, the gate stack 204 is electrically connected to a conductor 210A for interconnection, as shown in FIG. 2A. The conductor 210A may be a conductive line. The source region 206 is electrically connected to a conductor 212A for interconnection. The conductor 212A may be a conductive line. The drain region 202 is electrically connected to a conductor 212B for interconnection. The conductor 212B may be a conductive line. The conductors 212A and 212B may be formed from patterning the same conductive film. The conductors 212A and 212B may be conductive lines at the same height level. In some embodiments, top surfaces of the conductors 212A and 212B are substantially coplanar. In some embodiments, the conductors 212A and 212B are electrically isolated from each other. In some embodiments, the conductor 210A is at a lower height level than the conductors 212A and 212B. In some embodiments, a portion of the conductor 210A is positioned below the conductor 212A, as shown in FIG. 2A. One or more dielectric layers may be formed between the conductors 212A and 210A.

In some embodiments, as shown in FIG. 2A, a connection area 7, including pickup regions D, S and G, separated from the transistor T is provided to facilitate interconnection of the drain region 202, the source region 206, and the gate stack 204, respectively.

In some embodiments, a portion of the conductor 210A takes the form of a discontinuous ring over the ring-shape gate stack 204, as shown in FIG. 2A. In some embodiments, a portion of the conductor 212B extends in the I-I' direction between the drain region 202 and the connection area 7. The conductors 212B and 210A are designed to be not overlapping each other. Therefore, an undesirable coupling effect between the conductors 212B and 210A may be prevented or reduced.

In some embodiments, the transistor T includes a metal-oxide-semiconductor field-effect transistor (MOSFET). In some other embodiments, the transistor T includes a high-voltage MOSFET capable of operating at high voltage that is, for example, in a range from about 250 V to about 1000 V. Alternatively, the transistor T includes bipolar junction transistors (BJTs), complementary MOS (CMOS) transistors, etc. In some embodiments, the transistor T is used in a power device, such as a power diode and a thyristor.

FIG. 2B shows a cross-sectional view of the semiconductor device structure 200 as shown in FIG. 2A taken along a line I-I', in accordance with some embodiments. In some embodiments, the semiconductor device structure 200 includes a semiconductor substrate 201 and doped regions 214 and 216. In some embodiments, the doped regions 214 and 216 are well regions with opposite conductivity types. For example, the doped region 214 may be n-type doped, and the doped region 216 may be p-type doped. In some embodiments, the doped region 216 is a ring region laterally surrounds the drain region 202. The doped region 216 may surround or cover sides and a bottom of the source region 206, as shown in FIG. 2B.

In some embodiments, the doped region 214 has a periphery (or boundary) 226 which defines the periphery of the high-voltage device region $R_1$. In some embodiments, the doped region 214 in the high-voltage device region $R_1$ is in direct contact with the doped region 224 in the low-voltage device region $R_2$. The periphery 226 may also be an interface between the doped regions 214 and 224. In some embodiments, the doped regions 214 and 224 are well regions having opposite conductivity types. In some embodiments, the doped region 214 is n-type, and the doped region 224 is p-type. In some other embodiments, the doped region 214 is p-type, and the doped region 224 is n-type.

In some embodiments, the drain region 202 of the transistor T is formed in the doped region 214 in the semiconductor substrate 201. The doped region 214 surrounds or covers the sides and bottom of the drain region 214, as shown in FIG. 2B. In some embodiments, the drain region 202 and the doped region 214 have the same conductivity type. For example, both the drain region 202 and the doped region 214 are n-type doped. In some embodiments, the drain region 202 has a greater dopant concentration than that of the doped region 214.

In some embodiments, the source region 206 of the transistor T is formed in the doped region 216 within the doped region 214. The doped region 214 surrounds or covers the sides and bottoms of the drain region 202 and the doped region 216, as shown in FIG. 2B. In some embodiments, the source region 206 and the doped region 216 have opposite conductivity types. For example, the source region 206 is n-type doped, and the doped region 216 is p-type doped.

In some embodiments, the gate stack 204 of the transistor T is disposed over the doped region 214 and extends on an isolation structure 207. The isolation structure 207 may be similar to the isolation structure 208. The gate stack 204 may include a gate dielectric layer 205A and a gate electrode 205B. The gate dielectric layer 205A may be made of silicon oxide or another suitable high-k dielectric material. The gate electrode 205B may be made of polysilicon. In some other embodiments, the gate electrode 205B is a metal gate electrode. The metal gate electrode may include one or more work function layers. In some embodiments, the gate stack 204 has a ring structure, as shown in FIG. 2A.

As shown in FIG. 2B, a channel region 15 may be defined under the gate stack 204 between the drain region 202 and the source region 206 in the doped region 214. The dopant type of the doped region 216 is opposite to that of the doped region 214. For example, when the doped region 216 is p-type, then the doped region 214 is n-type. Alternatively, when the doped region 216 is n-type, then the doped region 214 is p-type. In some embodiments, the doped region 214 is a high-voltage n-well.

As shown in FIGS. 2A and 2B, the drain region 202 is electrically connected to the connection area 7 through conductive features including a conductive contact 218, a conductor 210B, a conductive via 220, and the conductor 212B, in accordance with some embodiments. The conductive features are surrounded with multiple dielectric layers including, for example, dielectric layers 222A, 222B, and 222C. One or more etch stop layers (not shown) may be formed between the dielectric layers. The isolation structure 207 defines a length of the drain region 202.

In some embodiments, the semiconductor substrate 201 is made of or includes silicon, silicon germanium, gallium arsenic, silicon carbon, one or more other suitable semiconductor materials, or a combination thereof. In some embodiments, the semiconductor substrate 201 is semiconductor on insulator such as silicon on insulator (SOI). In some other embodiments, the semiconductor substrate 201 includes a doped epi-layer, a gradient semiconductor layer, or further includes a semiconductor layer overlying another semiconductor layer of a different type such as a silicon layer on a silicon germanium layer.

In some embodiments, the semiconductor substrate 201 is doped with a dopant of p-type, and the drain region 202 and source region 206 are doped with a dopant of n-type. As such, the semiconductor substrate 201, the drain region 202, and source region 206 define an n-type semiconductor device, such as an n-channel metal-oxide-semiconductor field effect transistor (MOSFET). Alternatively, for example, the semiconductor substrate 201 is doped with a dopant of n-type, and the drain region 202 and the source region 206 are doped with a dopant of p-type. As such, the semiconductor substrate 201, the drain region 202, and the source region 206 define a p-type semiconductor device, such as a p-channel metal-oxide-semiconductor field effect transistor (MOSFET).

It should be noted that a drain region and a source region are interchangeable depending on a voltage applied thereto. In an n-type metal-oxide-semiconductor field-effect transistor (NMOS), a drain region may receive a first voltage, and a source region may receive a second voltage lower than the first voltage. In a p-type metal-oxide-semiconductor field-effect transistor (PMOS), a drain may receive a first voltage, and a source may receive a second voltage higher than the first voltage.

During operation of the transistor T in the high-voltage device region $R_1$, a high voltage may be applied to the drain region 202 through the conductor 212B. When the high voltage is applied to the high-voltage device through the conductor 212B, the conductor 212B may negatively affect the operation of the low-voltage device in the low-voltage device region $R_2$. For example, an inversion channel region may be unintentionally formed in the doped region 224 near the periphery 226 of the doped region 214. Once the inversion channel region is formed, an electrical path leading to high leakage current between the doped regions 214 and 224 may be formed.

As shown in FIGS. 2A and 2B, a shielding element 228 is formed over and across the interface between the high-voltage device region $R_1$ and the low-voltage device region $R_2$, in accordance with some embodiments. In some embodiments, the shielding element 228 is a shielding element ring, as shown in FIG. 2A. In some embodiments, the shielding element 228 has a first portion 228A extending on the high-voltage device region $R_1$. The shielding element 228 also has a second portion 228B extending into the low-voltage device region $R_2$. The shielding element 228 may be used to prevent the formation of the inversion channel region near the periphery 226 of the doped region 214 that is directly below the shielding element 228.

In some cases where a high voltage bias is applied on the conductor 212B, an outer portion of the doped region 224 not covered by the shielding element 104 may become a strong inversion channel region due to the high electric field generated from the conductor 212B. Electrons may accumulate in the inversion channel region. Meanwhile, a portion of the doped region 214 directly below the first portion 228A and an inner portion of the doped region 224 directly below the second portion 228B are shielded or protected by the shielding element 104. Due to the shielding element 228, electric field generated from the conductor 212B is shield to avoid accumulating electrons in the region under the shielding element 228. That is, the region directly below the shielding element 228 is prevented from becoming an inversion channel region. The doped region 214 is therefore electrically separated from the inversion channel region in the outer portion of the doped region 224 by the region directly below the shielding element 228. For example, even if the outer portion of the doped region 224 becomes an inversion channel region, the inner portion of the doped region 224 is not inversed and still acts as a p-type doped well region. Electrons are prevented from penetrating through the inner portion of the doped region 224 shielded by the shielding element 228. Leakage path from the high-voltage region $R_1$ to the low-voltage region $R_2$ is therefore avoided. Carriers from the doped region 214 are also prevented from entering the doped region 224. Leakage current may therefore be avoided or reduced. In some embodiments, the shielding element 228 is positioned between the conductor 212B and the periphery 226 of the doped region 214 (which is also the periphery of the high-voltage device region $R_1$).

In some embodiments, the shielding element 228 extends over and across the periphery 226. In some embodiments, the shielding element 228 covers the entire top surface of the periphery 226 of the high-voltage device region $R_1$. In some embodiments, the shielding element 228 encircles the high-voltage device region $R_1$. The shielding element 228 laterally surrounds the doped regions 214 and 216, the source region 206, the gate stack 204, and the drain region 202.

In some embodiments, the shielding element 228 is made of a conductive material. The conductive material may include a metal material, a semiconductor material, one or more other suitable materials, or a combination thereof. In some embodiments, the shielding element 228 and the gate electrode 205B are made of the same material. In some embodiments, a polysilicon layer is formed first, and then the polysilicon layer is patterned to form the gate electrode 205B and the shielding element 228. In some embodiments, a dielectric layer 229 is formed between the shielding element 228 and the semiconductor substrate 201. In some embodiments, the dielectric layer 229 and the gate dielectric layer 205A are made of the same material. In some embodiments, the dielectric layer 229 and the gate dielectric layer 205A are formed by patterning the same dielectric film.

The high electrical field from the conductor 212B may be blocked or at least partially blocked by the shielding element 228. Therefore, the elements thereunder may be prevented from being negatively affected by the conductor 212B applied with high voltage. Due to the shielding element 228, there is substantially no inversion channel region formed near the region covered by the shielding element 228. Even if an outer portion of the doped region 224 becomes an inversion channel region, the inner portion of the doped region 224 that still acts as a p-type well region may block the accumulated electrons in the inversion channel regions from entering the doped region 214. No conductive path is formed between doped regions 214 and 224. Leakage current is significantly reduced. The performance and reliability of the semiconductor device structure 200 are significantly improved. Since the shielding element 228 may be used to cut the undesired electrical connection path between the high-voltage device region $R_1$ and low-voltage device region $R_2$, the low-voltage devices may be formed or designed to be closer to the high-voltage device region $R_1$. For example, the well regions of the high-voltage device region $R_1$ and low-voltage device region $R_2$ may be formed or designed to be in direct contact with each other. The layout design of the high-voltage device region $R_1$ and low-voltage device region $R_2$ becomes more flexible. It may not be needed to design a forbidden area surrounding the high-voltage device region R₁, which facilitates the scaling-down and performance improvement of the semiconductor device structure.

The shielding element 228 may also have some other advantages. For example, some advantages of the shielding element 228 are discussed below by way of comparison between an existing approach without such shielding element 228 and the transistor T with the shielding element 228. In some existing transistors free of a protective layer (or a barrier layer) such as the shielding element 228, an electric field established by an interconnect structure such as the conductor 212B might adversely affect an isolation component, such as the isolation structure 208, disposed near the source region 206 of the transistor. Consequently, degradation on the voltage level at the source region 206 may be likely to occur.

In some cases, the semiconductor device structure 200 is not provided with the shielding element 228, the semiconductor substrate 201 is a p-type substrate, the doped region 214 is an n-well, and the doped region 216 is a p-well. Since the electric field is very strong due to an ultra-high voltage, negative charge in the doped region 214 (n-well) is accelerated by the electric field, injected from the n-doped region 214 to the isolation structure 208 and trapped in the isolation structure 208 due to quantum mechanical direct tunneling or Fowler-Nordheim tunneling. The trapped negative charge in the isolation structure 208 depletes the n-doped region 214 near the isolation structure 208, resulting in positive charge in the n-doped region 214. Consequently, punch-through may occur in the n-doped region 214 under the isolation structure 208, leading to leakage from the p-doped region 216 via the n-doped region 214 under the isolation structure 208 towards the semiconductor substrate 201. As a result, the voltage level at the source region 206 is decreased (i.e., degradation) when the transistor T is enabled.

In some embodiments in FIG. 2B, the semiconductor substrate 201 is a p-type substrate, the doped region 214 is an n-well and the doped region 216 is a p-well. Since the electric field is shielded by the shielding element 228, negative charge in the n-doped region 214 is not accelerated by the electric field and therefore is not injected from the n-doped region 214 to the isolation structure 208. The negative charge still remains in the n-doped region 214. Accordingly, substantially no depletion occurs in the n-doped region 214 under the isolation structure 208. Substantially no punch-through occurs in the n-doped region 214 under the isolation structure 208. There is substantially no leakage current path from the p-doped region 216 to the semiconductor substrate 201. As a result, the voltage level at the source region 206 may substantially be kept intact and thus no degradation occurs when the transistor T is enabled.

Many variations and/or modifications can be made to embodiments of the disclosure. In some embodiments, the conductor 212B extending across the periphery 226 of the doped region 214 is not electrically connected to the drain region 202. In some embodiments, the conductive layer extending across the periphery 226 of the doped region 214 is electrically connected to the source region 206.

Figure 3:
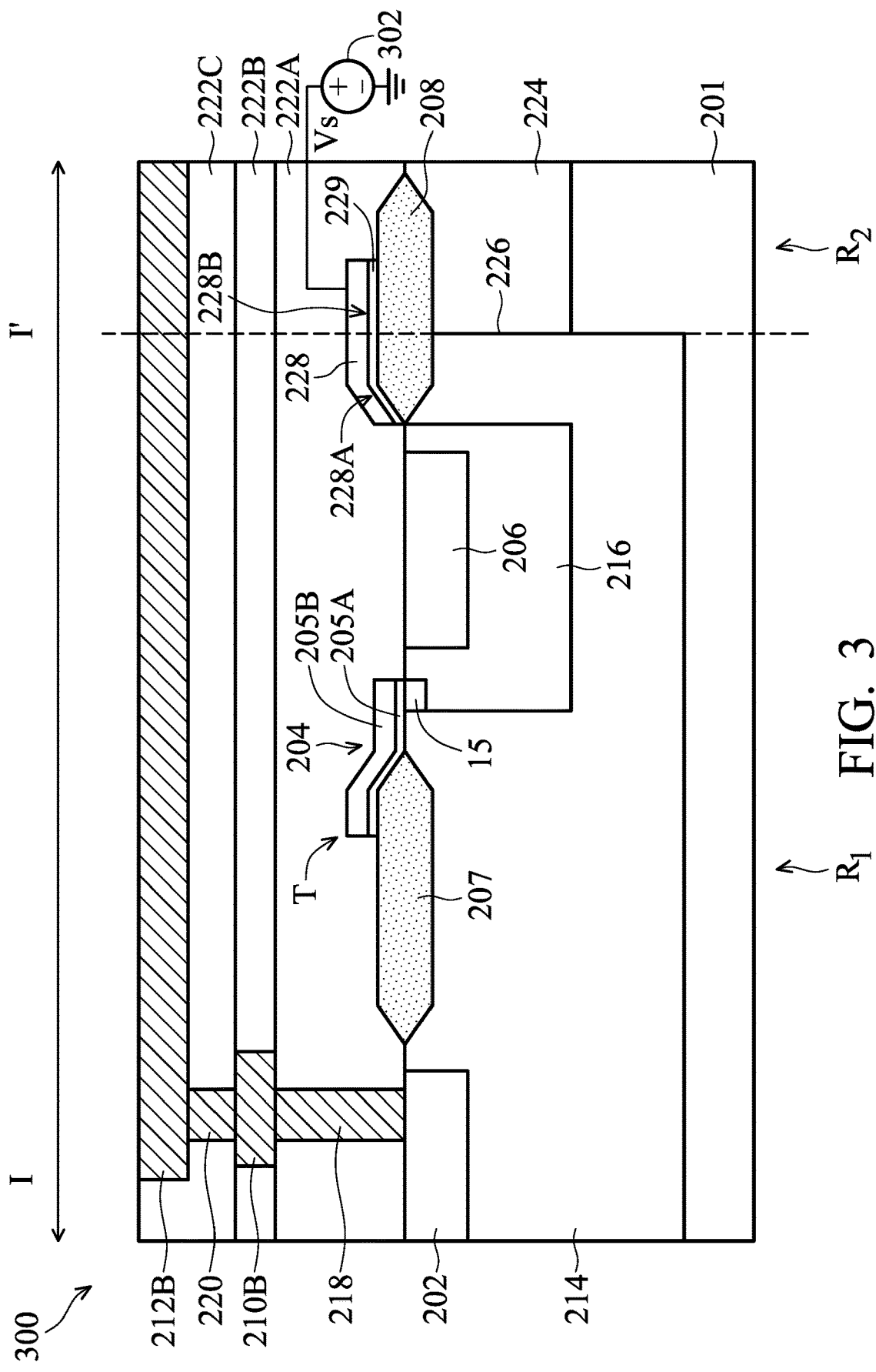
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure 300, in accordance with some embodiments.

Referring to FIG. 3, the semiconductor device structure 300 is similar to the semiconductor device structure 200 described and illustrated with reference to FIG. 2B. The main difference therebetween may include that the semiconductor device structure 300 includes a conductive element such as a voltage source 302.

The voltage source 302 is configured to provide a voltage Vs to the shielding element 228. Since the voltage level of the shielding element 228 serving as a shield component is Vs, a source floating capability (SFC) of the transistor T is enhanced, as will be discussed further below. Source floating capability refers to a voltage level at which a source terminal of a transistor can float. A higher voltage level at the source terminal of the transistor would lead to better source floating capability.

Assuming that the semiconductor substrate 201 is a p-type substrate, the doped region 214 is an n-well and the doped region 216 is a p-well, the majority carrier in the n-doped region 214 is electron, while the majority carrier in the p-doped region 216 is electron hole. When the voltage Vs is applied to the shielding element 228, the shielding element 228 may induce negative charge from the reference ground through the semiconductor substrate 201 to the n-doped region 214. The negative charge may be accumulated in the n-doped region 214. The shielding element 228 raised to the voltage level Vs may facilitate accumulation of negative charge in a part of the n-doped region 214 adjacent to the p-doped region 216. The negative charge has the same electrical type as the majority carrier in the n-doped region 214. Accordingly, the amount of negative-type charge in the n-doped region 214, in a condition that the shielding element 228 is biased, is greater than that in a condition that the shielding element 228 is floating. The accumulated negative-type charge may facilitate to block the leakage current path to the semiconductor substrate 201 or to the low-voltage device region R₂. The source floating capability may be enhanced.

The enhanced source floating capability may enable the source of the transistor T to operate at a higher voltage level. Therefore, the transistor T may be more power efficient. When the transistor T is disabled, the source voltage of the transistor T at a higher level may cause the gate-to-source voltage (VGS) of the transistor T to accordingly decrease. As a result, leakage current from the disabled transistor T is reduced or even eliminated. The transistor T may have no parasitic power dissipation resulting from the leakage current. The semiconductor device structure 300 may not only prevent the degradation on the voltage level at the source region 206 of the transistor T, but also may enhance the source floating capability.

Figure 4:
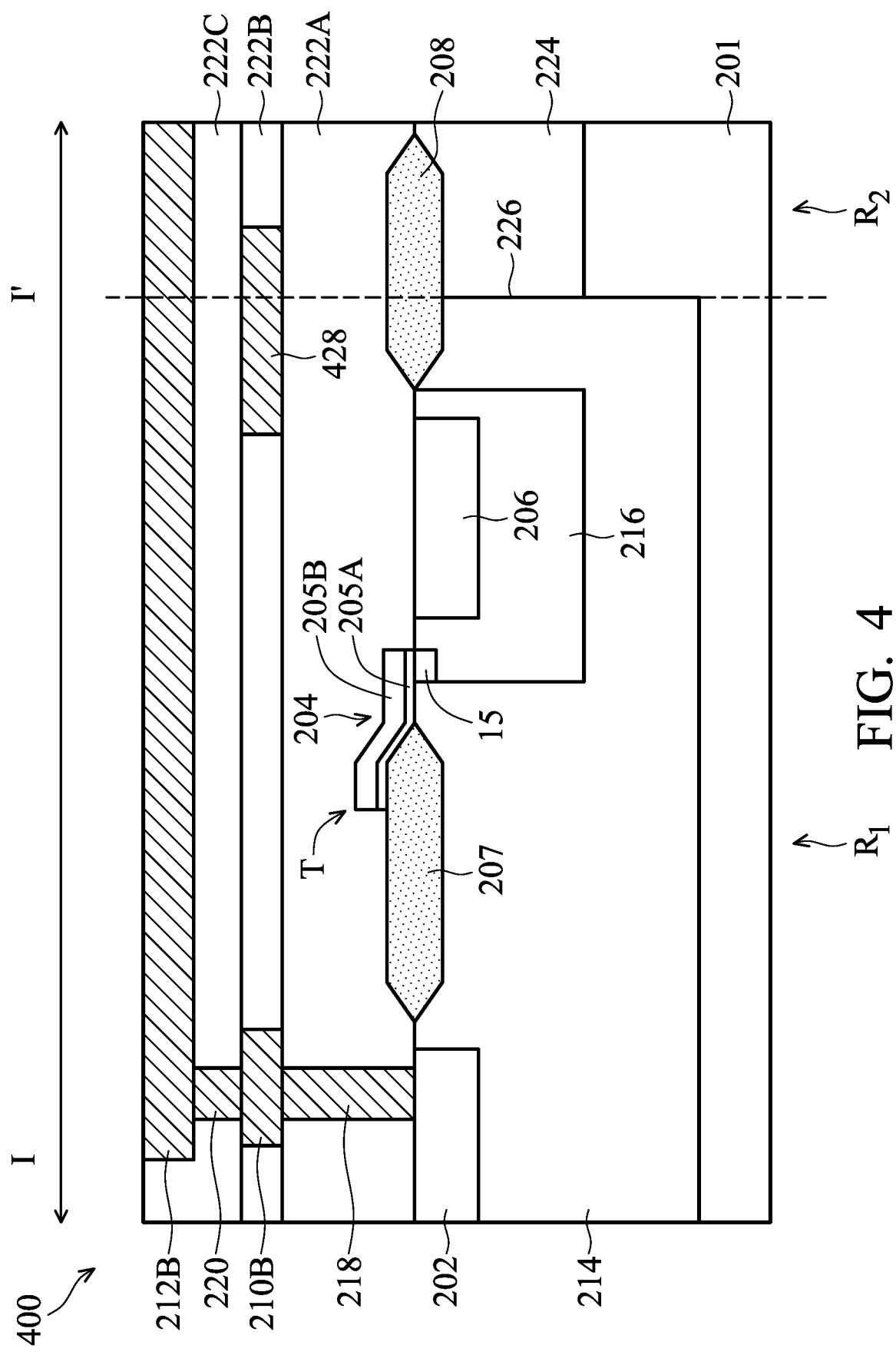
FIG. 4 is a cross-sectional view of a semiconductor device structure, in accordance with some embodiments.

FIG. 4 is a cross-sectional view of a semiconductor device structure 400, in accordance with some embodiments. The semiconductor device structure 400 may be similar to the semiconductor device structure 200 illustrated in FIG. 2B. The main difference therebetween may include that the position of the shielding element is changed. In some embodiments, the shielding element 228 is replaced with a shielding element 428. In some embodiments, the shielding element 428 is a ring structure. In some embodiments, the shielding element 428 extends over and across the periphery 226. In some embodiments, the shielding element 428 covers an entirety of the periphery 226.

Unlike the shielding element 228 that is disposed directly on the isolation structure 208, the shielding element 428 is disposed over the isolation structure 208. For example, the shielding element 428 is formed over the dielectric layer 222A. The shielding element 428 is configured to alleviate the effect of an electric field established by the conductor 212B. For similar reasons as provided in the embodiment of FIG. 2B, since the shielding element 428 is disposed between the conductor 212B and the periphery 226 of the high-voltage device region R₁, the current leakage is significantly reduced or prevented. The effect of the electric field on the isolation structure 208 is also weakened or even eliminated. As a result, degradation on a voltage level at the source region 206 may also be alleviated or even eliminated.

In some embodiments, the shielding element 428 is made of or includes a semiconductor material, a metal material, one or more other suitable materials, or a combination thereof. In some embodiments, the shielding element 428 and the conductor 210B are formed from patterning the same conductive film. In these cases, the shielding element 428 and the conductor 210B are made of the same material. In some embodiments, the shielding element 428 is substantially as high as the conductor 210B. In some embodiments, top surfaces of the shielding element 428 and the conductor 210B are substantially positioned at the same height level.

Many variations and/or modifications can be made to embodiments of the disclosure. In some other embodiments, both the shielding element 428 and the shielding element 228 are formed.

Figure 5:
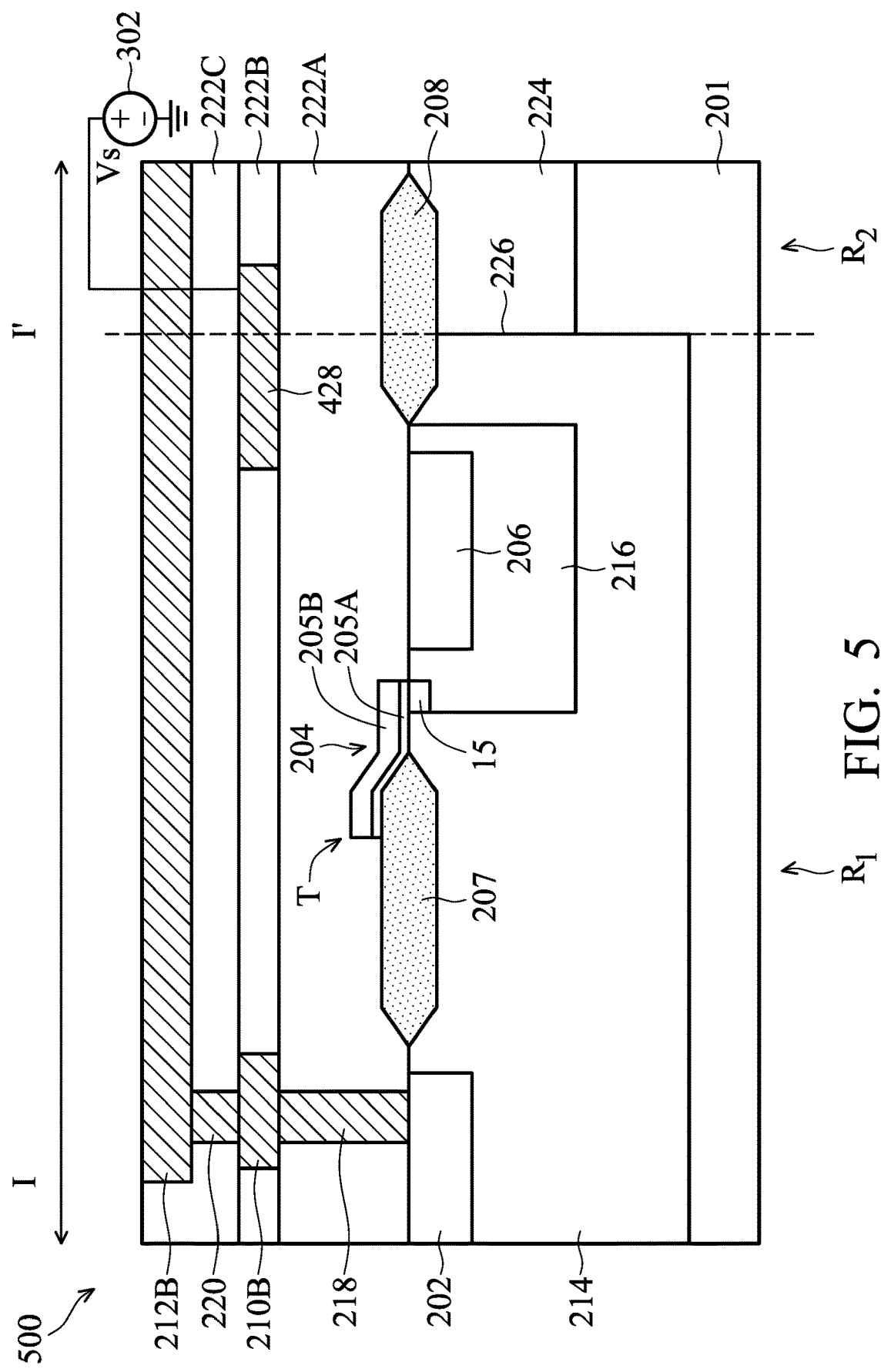
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure 500, in accordance with some embodiments. The semiconductor device structure 500 may be similar to the semiconductor device structure 400 illustrated in FIG. 4.

As shown in FIG. 5, a conductive element such as a voltage source 302 is provided, in accordance with some embodiments. The voltage source 302 is configured to provide a voltage Vs to the shielding element 428. The shielding element 428 raised to the voltage Vs may facilitate accumulation of charge in the doped region 214. Accordingly, source floating capability (SFC) of the transistor T is enhanced. For the similar reasons as provided in the embodiment of FIG. 3, as a result of the enhanced source floating capability, leakage current in the disabled transistor T may also be reduced or even eliminated. Accordingly, the semiconductor device structure 500 may not only prevent the degradation on the voltage level of the source region 206 of the transistor T, but also enhances the source floating capability.

Figure 6:
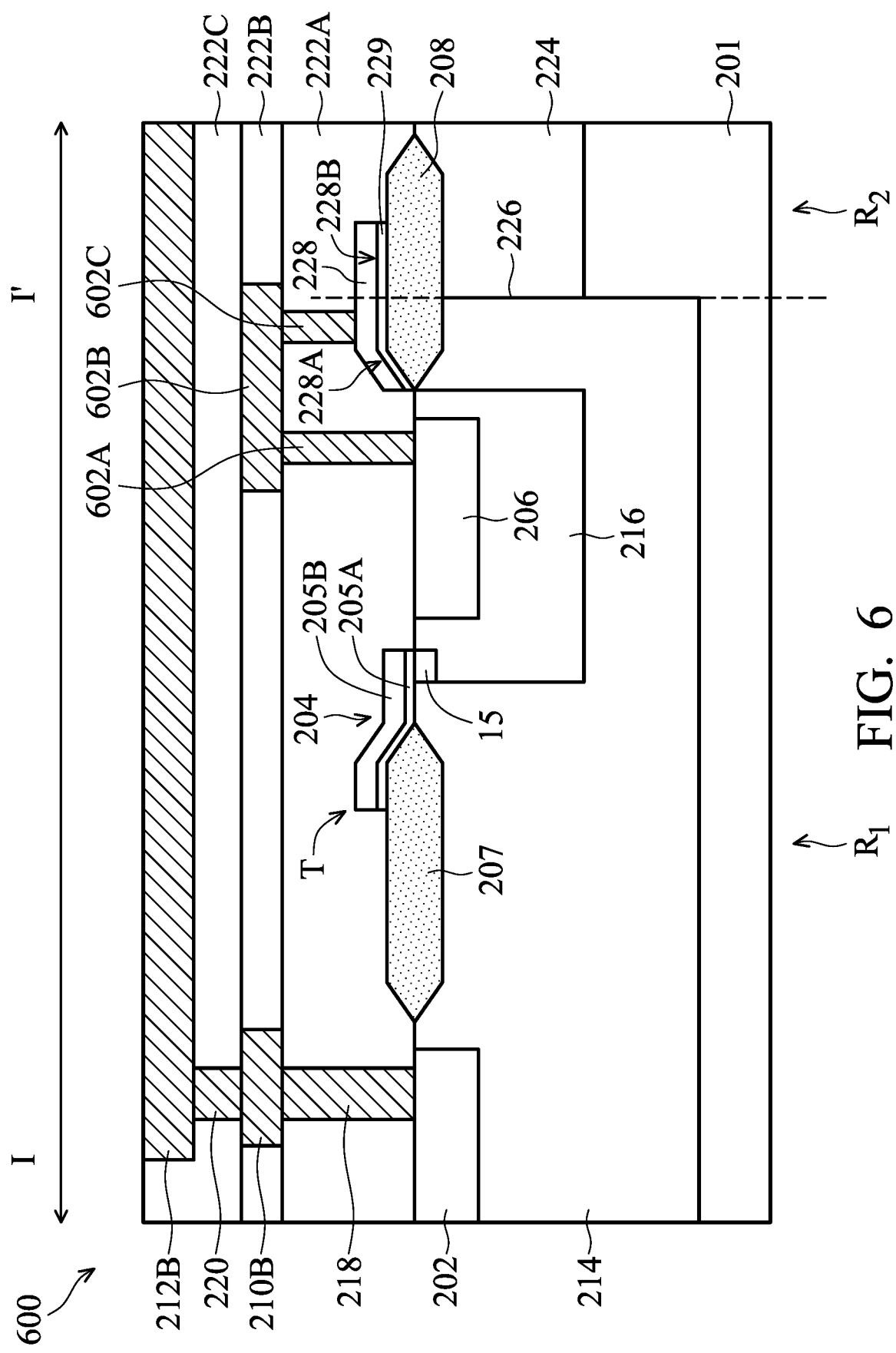
FIG. 6 is a cross-sectional view of a semiconductor device structure, in accordance with some embodiments.

Many variations and modifications can be made to embodiments of the disclosure. FIG. 6 is a cross-sectional view of a semiconductor device structure 600, in accordance with some embodiments. The semiconductor device structure 600 may be similar to the semiconductor device structure 200 illustrated in FIG. 2B.

In some embodiments, the source region 206 and the shielding element 228 are electrically shorted together. In some embodiments, conductive features 602A, 602B, and 602C are used to short the source region 206 and the shielding element 228 together. The conductive features 602A and 602C may include conductive contacts and/or conductive vias. The conductive feature 602B may be a conductive line.

When the transistor T is enabled, the conductive layer 602B raised to a voltage level as the source region 206 may facilitate accumulation of charge in the doped region 214. Accordingly, the source floating capability (SFC) of the transistor T is enhanced. For the similar reasons provided in the embodiment of FIG. 3, as a result of the enhanced source floating capability, leakage current in the transistor T when disabled is reduced or even eliminated. Accordingly, the transistor T may have substantially no parasitic power dissipation resulting from the leakage current.

Figure 7:
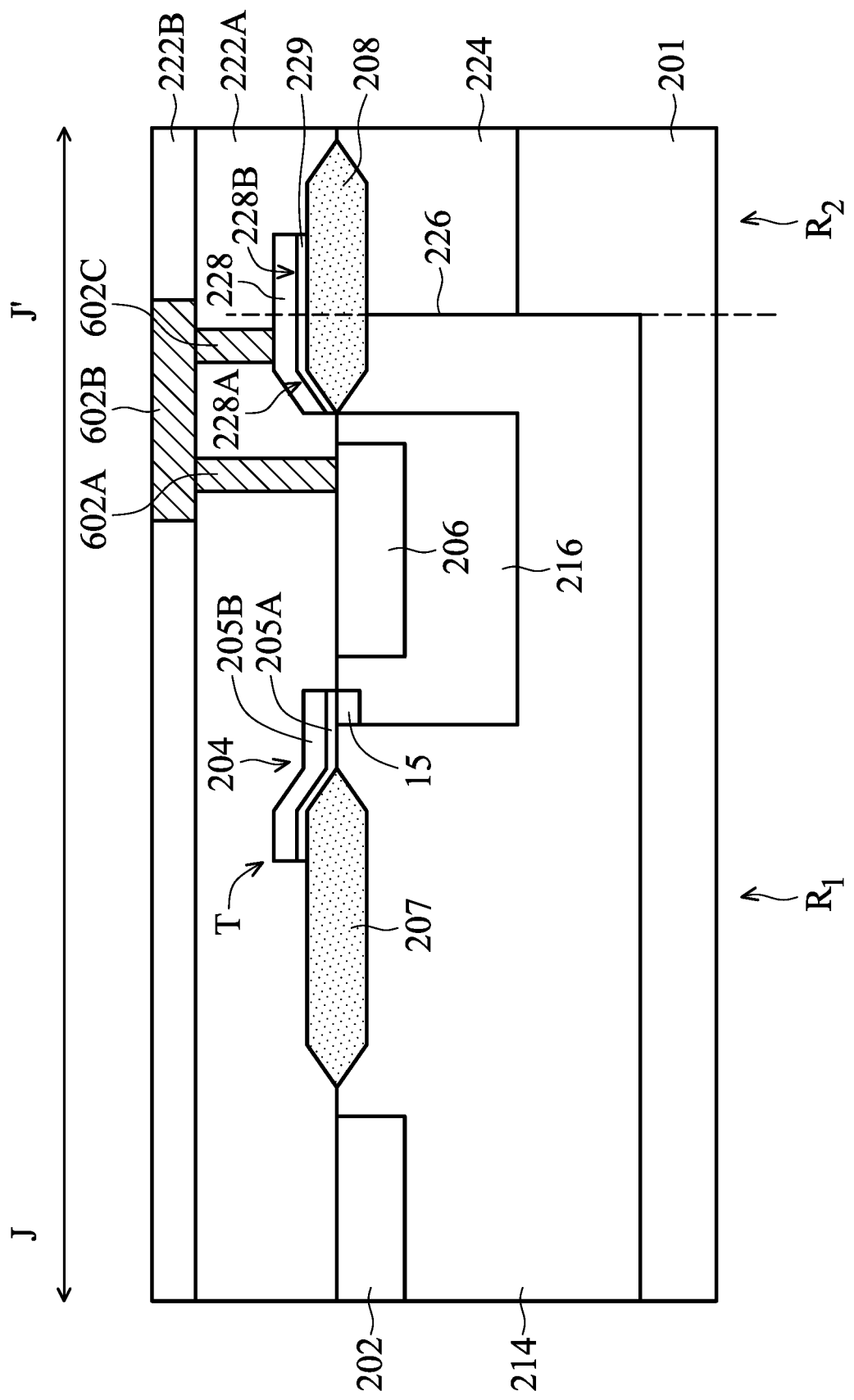
FIG. 7 is a cross-sectional view of a semiconductor device structure, in accordance with some embodiments.

Many variations and/or modifications can be made to embodiments of the disclosure. FIG. 7 is a cross-sectional view of a semiconductor device structure 700, in accordance with some embodiments. In some embodiments, the conductive features 602A, 602B, and 602C are not formed directly below the conductor 212B. The conductive features 602A, 602B, and 602C may be designed to be positioned at different positions. In some embodiments, FIG. 7 shows the cross-sectional view of the structure shown in FIG. 2A taken along the line J-J'. In some embodiments, the conductive features 602A, 602B, and 602C formed for shorting the shielding element 228 and the source region 206 are formed at a position other than directly below the conductor 212B.

Figure 8A:
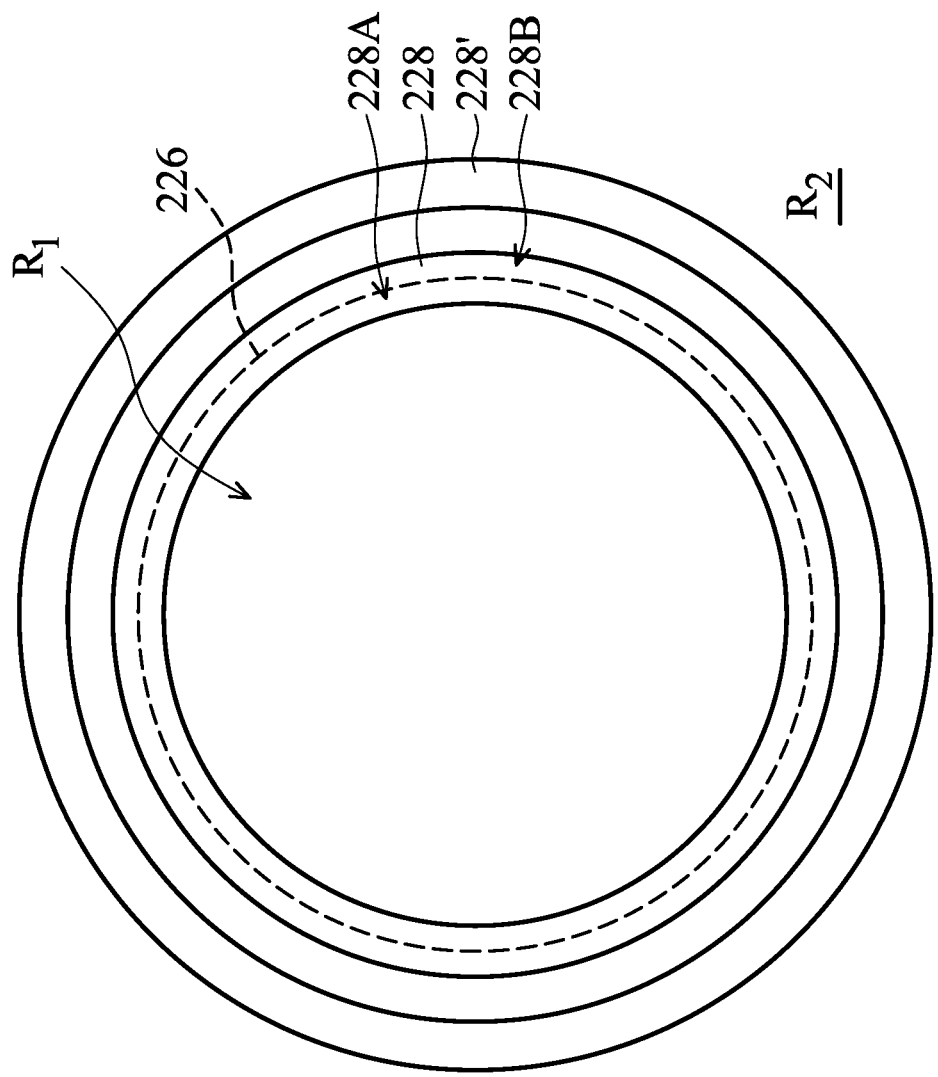
FIG. 8A is a layout top view of a semiconductor device structure, in accordance with some embodiments.
Figure 8B:
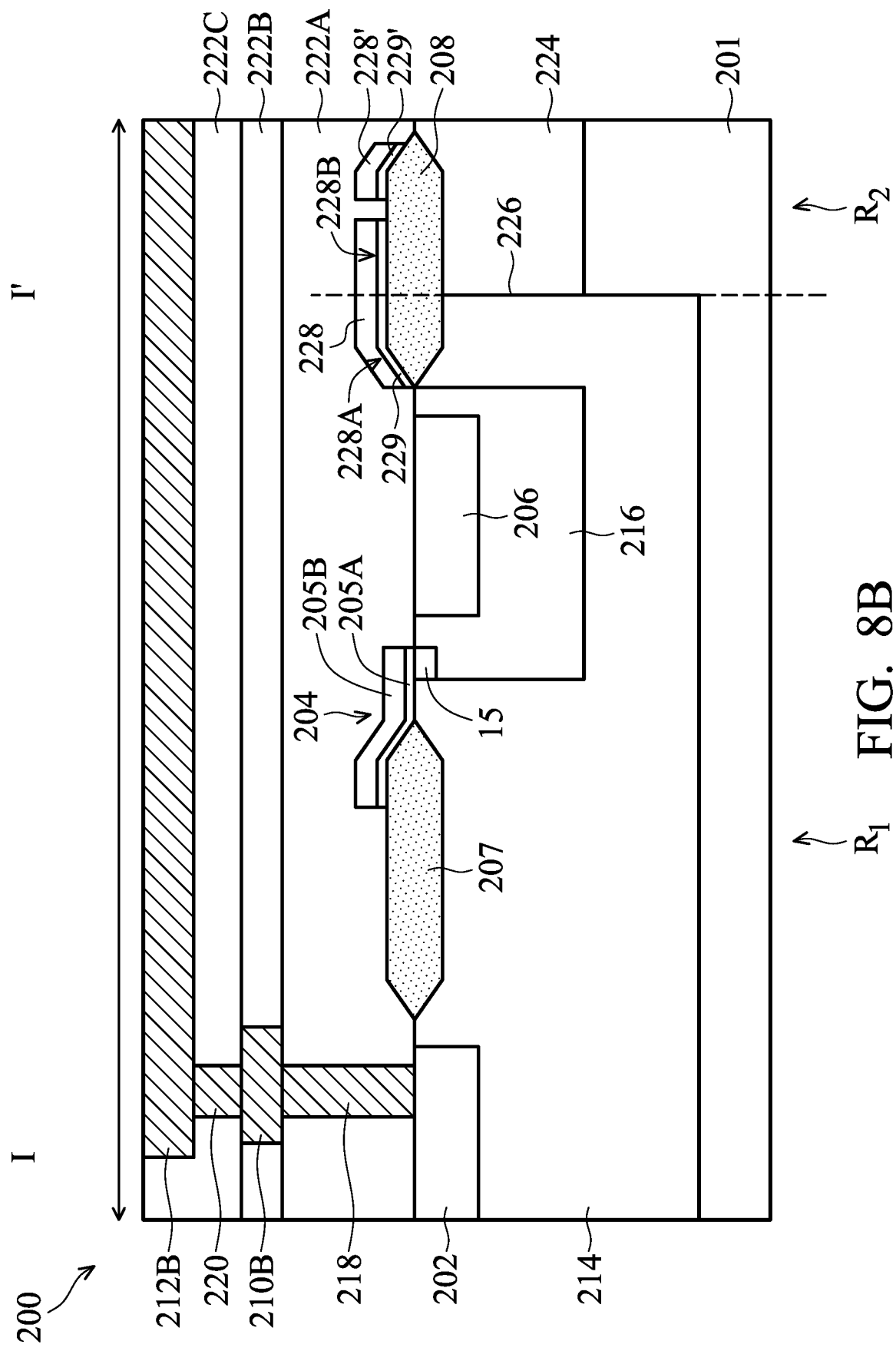
FIG. 8B is a cross-sectional view of a semiconductor device structure, in accordance with some embodiments.

Many variations and/or modifications can be made to embodiments of the disclosure. FIG. 8A is a layout top view of a semiconductor device structure, in accordance with some embodiments. FIG. 8B is a cross-sectional view of a semiconductor device structure, in accordance with some embodiments. In some embodiments, FIG. 8A shows the layout top view of the structure shown in FIG. 8B. For clarity, some elements in FIG. 8B are not shown in FIG. 8A. As shown in FIGS. 8A and 8B, a second shielding element 228' is formed, in accordance with some embodiments. The second shielding element 228' may be used to ensure no current leakage path is formed between the high-voltage device region R₁ and the low-voltage device region R₂. In some embodiments, the second shielding element 228' is a ring structure. In some embodiments, the second shielding element 228' laterally surrounds the shielding element 228 which laterally surrounds the high-voltage device region R₁ and covers the periphery 226 between the high-voltage device region R₁ and the low-voltage device region R₂. In some embodiments, the second shielding element 228' encircles the shielding element 228.

In some embodiments, the second shielding element 228' and the shielding element 228 are formed from patterning the same material layer. In these cases, the shielding elements 228 and 228' are made of the same material. In some embodiments, top surfaces of the shielding elements 228 and 228' are substantially as high as each other. In some embodiments, a dielectric layer 229' may be formed below the second shielding element 228'. The dielectric layers 229' and 229 may be made of the same material.

Many variations and/or modifications can be made to embodiments of the disclosure. In some other embodiments, one or more shielding elements are formed to laterally surround or encircle the shielding elements 228 and 228' to ensure that no leakage current path is formed.

Embodiments of the disclosure form a semiconductor device structure with a high-voltage device region and a low-voltage device region. One (or more) shielding element is formed to extend across an interface between the high-voltage device region and the low-voltage device region. High electrical field generated from the high-voltage device region is shielded by the shielding element to prevent leakage current path from being formed and passing through the interface of the high-voltage device region and the low-voltage device region. The reliability and performance of device elements in the high-voltage device region and the low-voltage device region are significantly improved. It may not be needed to design a forbidden area between the high-voltage device region and the low-voltage device region, which facilitates the scaling-down of the semiconductor device structure.

In accordance with some embodiments, a high-voltage semiconductor device structure is provided. The high-voltage semiconductor device structure includes a semiconductor substrate, a source ring in the semiconductor substrate, and a drain region in the semiconductor substrate. The high-voltage semiconductor device structure also includes a doped ring surrounding sides and a bottom of the source ring and a well region surrounding sides and bottoms of the drain region and the doped ring. The well region has a conductivity type opposite to that of the doped ring. The high-voltage semiconductor device structure further includes a conductor electrically connected to the drain region and extending over and across a periphery of the well region. In addition, the high-voltage semiconductor device structure includes a shielding element ring between the conductor and the semiconductor substrate. The shielding element ring extends over and across the periphery of the well region.

In accordance with some embodiments, a semiconductor device structure is provided. The semiconductor device structure includes a semiconductor substrate having a high-voltage device region and a low-voltage device region. The semiconductor device structure also includes a first well region in the high-voltage device region, and the first well region surrounds sides and bottoms of a drain region and a source region. The semiconductor device structure further includes a second well region in the low-voltage device region and adjacent to the second well region, and the second well region has a conductivity type opposite to that of the first well region. In addition, the semiconductor device structure includes a conductor electrically connected to the drain region and extending across an interface between the first well region and the second well region. The semiconductor device structure further includes a shielding element ring between the conductor and the semiconductor substrate. The shielding element ring covers the interface between the first well region and the second well region.

In accordance with some embodiments, a semiconductor device structure is provided. The semiconductor device structure includes a high-voltage transistor including a source region in a first well region within a second well region and a drain region in the second well region. The semiconductor device structure also includes a low-voltage device including a doped region. The doped region has a conductivity type opposite to that of the second well region, and the doped region is adjacent to the second well region. The semiconductor device structure further includes a conductor electrically connected to the high-voltage transistor and extending across an interface between the doped region of the low-voltage device and the second well region of the high-voltage transistor. In addition, the semiconductor device structure includes a shielding element ring between the conductor and the doped region. The shielding element ring extends over and across the interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-voltage semiconductor device structure, comprising:
    a semiconductor substrate;
    a source ring in the semiconductor substrate;
    a drain region in the semiconductor substrate;
    a doped ring surrounding sides and a bottom of the source ring;
    a well region surrounding sides and bottoms of the drain region and the doped ring, wherein the well region has a conductivity type opposite to that of the doped ring;
    a conductor electrically connected to the drain region and extending over and across a periphery of the well region; and
    a shielding element ring between the conductor and the semiconductor substrate, wherein the shielding element ring extends over and across the periphery of the well region, and wherein the shielding element ring laterally surrounds the well region, the source ring, and the drain region.

2. The high-voltage semiconductor device structure as claimed in claim 1, wherein the doped ring is a p-type well region, and the well region is n-type doped.

3. The high-voltage semiconductor device structure as claimed in claim 1, further comprising a second doped region in the semiconductor substrate, wherein a portion of the second doped region is below the shielding element ring, the second doped region has a conductivity type opposite to that of the doped ring, and the second doped region is in direct contact with the doped ring.

4. The high-voltage semiconductor device structure as claimed in claim 1, wherein the source ring and the shielding element ring are shorted together.

5. The high-voltage semiconductor device structure as claimed in claim 1, wherein the shielding element ring comprises a semiconductor material, a metal material, or a combination thereof.

6. The high-voltage semiconductor device structure as claimed in claim 1, further comprising a dielectric layer between the shielding element ring and the semiconductor substrate.

7. The high-voltage semiconductor device structure as claimed in claim 1, further comprising a second doped ring adjacent to the well region, wherein:
    the conductivity type of the well region is opposite to that of the second doped ring, and
    the shielding element ring covers a portion of the second doped ring.

8. The high-voltage semiconductor device structure as claimed in claim 1, further comprising an isolation element over the semiconductor substrate, wherein the isolation element laterally surrounds the source ring, and the shielding element ring covers at least a portion of the isolation element.

9. The high-voltage semiconductor device structure as claimed in claim 1, wherein the shielding element ring is electrically connected to a conductive element, and the shielding element ring is configured to be biased at a voltage level through the conductive element.

10. A high-voltage semiconductor device structure, comprising:
    a semiconductor substrate;
    a drain region in the semiconductor substrate;
    a doped ring encircling the drain region in the semiconductor substrate and having a first conductivity type;
    a source ring encircling the drain region and overlying the doped ring in the semiconductor substrate;
    a well region in the semiconductor substrate and underlying the drain region, the doped ring, and the source ring, wherein the well region has a second conductivity type opposite the first conductivity type, and wherein the well region has a sidewall boundary extending laterally in a closed path around the doped ring while remaining spaced from the doped ring;

a conductor electrically connected to the drain region; and a shielding element ring vertically between the conductor and the semiconductor substrate;

wherein the shielding element ring and the conductor overlie the sidewall boundary and are both on opposite sides of the sidewall boundary.

11. The high-voltage semiconductor device structure according to claim 10, wherein the shielding element comprises polysilicon.

12. The high-voltage semiconductor device structure according to claim 10, wherein the shielding element ring has a pair of sidewalls respectively on the opposite sides of the sidewall boundary, and wherein the sidewalls are laterally offset from the sidewall boundary.

13. The high-voltage semiconductor device structure according to claim 10, further comprising:

a gate electrode on opposite sides of a PN junction at which sidewalls respectively of the well region and the doped ring directly contact, wherein the gate electrode is level with the shielding element and on an opposite side of the doped ring as the shielding element ring.

14. The high-voltage semiconductor device structure according to claim 10, further comprising:

a ring-shaped isolation structure covering the sidewall boundary and surrounding the doped ring, wherein the shielding element ring overlies the ring-shaped isolation structure; and a second shielding element ring vertically between the conductor and the semiconductor substrate, wherein the second shielding element ring is on a single side of the sidewall boundary and overlies the ring-shaped isolation structure.

15. The high-voltage semiconductor device structure according to claim 10, wherein the shielding element ring laterally surrounds the well region, the source ring, and the drain region.

16. A high-voltage semiconductor device structure, comprising:

a semiconductor substrate;

a source ring in the semiconductor substrate;

a drain region in the semiconductor substrate;

a first doped ring surrounding sides and a bottom of the source ring in the semiconductor substrate;

a well region surrounding sides and bottoms of the drain region and the first doped ring in the semiconductor substrate, wherein the well region has a first conductivity type opposite a second conductivity type of the first doped ring;

a second doped ring surrounding sides of the well region in the semiconductor substrate and having the second conductivity type;

a conductor electrically connected to the drain region and extending over the first and second doped rings in a direction away from the drain region; and an electric-field shield ring underlying the conductor and extending in the direction from the first doped ring to directly over the second doped ring.

17. The high-voltage semiconductor device structure according to claim 16, wherein the well region and the second doped ring directly contact at a ring-shaped PN junction.

18. The high-voltage semiconductor device structure according to claim 16, further comprising:

a second conductor between the conductor and the drain region; and a pair of vias extending from the second conductor respectively to the conductor and the drain region;

wherein the electric-field shield ring is level with the second conductor.

19. The high-voltage semiconductor device structure according to claim 16, further comprising:

a gate electrode overlying a sidewall boundary of the first doped ring on an opposite side of the first doped ring as the electric-field shield ring, wherein the gate electrode, the drain region, the source ring, the first doped ring, and the well region at least partially define a transistor.

20. The high-voltage semiconductor device structure according to claim 16, wherein the conductor has a top layout that is line shaped and extends from directly over the drain region to directly over a connection area adjacent to and spaced from the well region.

\* \* \* \* \*